(12) United States Patent
Xi et al.

(10) Patent No.: US 10,249,611 B1
(45) Date of Patent: Apr. 2, 2019

(54) DIODE STRING CONFIGURED WITH GUARD RING SILICON-CONTROLLED RECTIFIER FOR NEGATIVE ELECTROSTATIC DISCHARGE PROTECTION

(71) Applicant: Silicon Laboratories Inc., Austin, TX (US)

(72) Inventors: Yunfeng Xi, Georgetown, TX (US); Jeremy C. Smith, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/964,260

(22) Filed: Apr. 27, 2018

(51) Int. Cl.
*H01L 27/02* (2006.01)
*H01L 29/06* (2006.01)

(52) U.S. Cl.
CPC ...... *H01L 27/0262* (2013.01); *H01L 27/0255* (2013.01); *H01L 29/0619* (2013.01); *H01L 29/0688* (2013.01)

(58) Field of Classification Search
None
See application file for complete search history.

(56) References Cited

U.S. PATENT DOCUMENTS

| | | | |
|---|---|---|---|
| 5,530,612 A | 6/1996 | Maloney | |
| 6,671,153 B1 * | 12/2003 | Ker | H01L 27/0255 361/111 |
| 9,502,399 B1 * | 11/2016 | Smith | H01L 27/0262 |

* cited by examiner

*Primary Examiner* — Joseph Schoenholtz
(74) *Attorney, Agent, or Firm* — Gary Stanford (57) ABSTRACT

A diode string for a semiconductor circuit configured with a guard ring silicon-controlled rectifier (SCR) for electrostatic discharge (ESD) protection. The diode string includes multiple NPN transistor diode structures formed in an N-well structure and electrically coupled in series between a reference voltage node and an I/O pad. Each diode structure may include a P-type retro-well structure including at least one N+ doped region and at least one P+ doped region. The P+ guard ring includes at least one P+ doped structure formed in the N-well structure disposed on either side of the first diode structure and electrically coupled to the reference voltage node. The P+ guard ring forms the SCR with the first diode structure. The diode string is triggered in response to an ESD event, which activates the SCR, and the SCR clamps the I/O pad to the reference voltage node and handles the ESD current.

20 Claims, 6 Drawing Sheets

DIODE STRING CONFIGURED WITH GUARD RING SILICON-CONTROLLED RECTIFIER FOR NEGATIVE ELECTROSTATIC DISCHARGE PROTECTION

BACKGROUND OF THE INVENTION

Field of the Invention

The present invention relates in general to electrostatic discharge (ESD) circuitry for ESD event protection, and more particularly to a semiconductor diode string configured with a guard ring silicon-controlled rectifier (SCR) for improved negative ESD protection.

Description of the Related Art

Electrostatic discharge (ESD) refers to the phenomenon whereby an electrical current of high magnitude and short duration is discharged at the package terminals of an integrated circuit due to static charge build-up on the integrated circuit (IC) package or on a nearby object, such as a human being or an IC handling machine. Without ESD protection circuitry, an ESD event can damage the IC. Accordingly, circuit designers have developed ESD protection circuitry to discharge ESD currents in a short time and in a nondestructive manner.

A diode string represents one type of ESD circuit that can be used to discharge ESD currents. The diode string is formed in bulk material of a semiconductor substrate by series-connected P-N junctions typically formed in N-well regions. In order to protect against positive ESD events, the diode string is formed between an input/output (I/O) pad and a positive power supply (e.g., VDD). Each diode in the string inherently forms a parasitic PNP bipolar transistor by default, so that the "diode string" is really a chain of PNP bipolar transistors. Within the diode string, each PNP transistor has a vertical current gain which effects the diode string operation, including the total substrate current, the effective turn-on resistance, and so on. As the process technologies advance and the semiconductor technology scales, the vertical current gain also tends to get smaller due to the N-well retrograde doping profile, in order to fight latch-up. Unfortunately, as the vertical current gain decreases, the turn-on resistance of the diode string increases, which can adversely impact the performance of the diode string in response to an ESD event by reducing the amount of current shunted to the substrate.

A solution for ESD events in the positive direction is described in U.S. Pat. No. 9,502,399, entitled "Diode String Circuit Configurations With Improved Parasitic Silicon-Controlled Rectifier (SCR) Conduction During Electrostatic Discharge (ESD) Events," which is incorporated herein by reference in its entirety for all purposes. The solution presented therein, however, was applicable to positive ESD events but was not applicable to negative ESD events. In many applications, including wireless communication applications and the like, an I/O pad may swing to a negative voltage level during normal operation. A relatively large negative signal swing expected during normal operation would otherwise require a correspondingly greater diode string length that is sub-optimal for ESD protection.

SUMMARY OF THE INVENTION

A semiconductor circuit according to one embodiment includes an N-well structure formed in a substrate, multiple N+ doped regions, a diode string and a P+ guard ring. The N-well structure and the N+ doped regions are coupled to a positive voltage node. The diode string includes multiple NPN transistor diode structures formed in the N-well structure and electrically coupled in series having a first diode structure disposed at a first end of the diode string and a last diode structure disposed at a second and opposite end of the diode string in which each diode structure is disposed between a corresponding consecutive pair of the N+ doped regions. The P+ guard ring includes at least one P+ doped structure formed in the N-well structure disposed on either side of the first diode structure and electrically coupled to a reference voltage node. The P+ guard ring forms a silicon-controlled rectifier (SCR) with the first diode structure.

The P+ guard ring may include first and second P+ doped structures disposed on either side of the first diode structure and electrically coupled to the reference voltage node. Each diode structure may include a P-type retro-well structure including at least one N+ doped region and at least one P+ doped region. The diodes may be coupled together by coupling the at least one P+ doped region of one diode structure to the at least one N+ doped region of a next diode structure. The N+ doped region(s) of each diode structure forms at least one parasitic NPN transistor with a deep N-well (DNW) portion of the N-well structure. Also, the P+ guard ring forms at least one parasitic PNP transistor coupled to each parasitic NPN transistor of the first diode structure to form the SCR. The positive supply rail of the semiconductor circuit may be used as the positive voltage node.

In one embodiment, the P+ guard ring includes first and second lightly doped P-type retro-wells formed in the N-well structure disposed on either side of the first diode structure and further includes a first P+ doped region formed in the first P-type retro-well and a second P+ doped region formed in the second P-type retro-well. In this embodiment, the SCR exhibits a relatively low holding current when activated by the diode string.

In an alternative embodiment, the P+ guard ring includes first and second P+ doped regions formed in the N-well structure on either side of the first diode structure. In this embodiment, the SCR exhibits a relatively high holding current when activated by the diode string.

An integrated circuit according to one embodiment includes a reference supply rail for developing a reference supply voltage, an input/output (I/O) pad, a positive voltage node, a P-type substrate and an N-well structure formed in the P-type substrate, in which the N-well structure is electrically coupled to the positive voltage node, multiple N+ doped regions formed in and distributed across the N-well structure each coupled to the positive voltage node, a diode string and a P+ guard ring. The diode string includes NPN transistor diode structures formed in the N-well structure and electrically coupled in series having a first diode structure disposed at a first end of the diode string and a last diode structure disposed at a second and opposite end of the diode string. Each diode structure is disposed between a corresponding consecutive pair of the N+ doped regions. The first diode structure is electrically coupled to the I/O pad and the last diode structure is coupled to the reference supply rail. The P+ guard ring includes at least one P+ doped structure formed in the N-well structure disposed on either side of the first diode structure and electrically coupled to the reference voltage node. The P+ guard ring forms a silicon-controlled rectifier (SCR) with the first diode structure.

The diode string may be configured to be triggered at a trigger voltage in response to a negative electrostatic discharge (ESD) event applied between the reference supply rail and the I/O pad. In this case, the SCR is activated in response to the diode string being triggered to clamp the I/O pad to the reference supply rail to dissipate remaining energy of the negative ESD event. When the SCR is activated, a holding voltage is developed across the SCR that is less than the trigger voltage, so that the diode string is turned off and the SCR conducts remaining current of the ESD event.

A method according to one embodiment includes using the SCR of an integrated circuit to discharge current of a negative electrostatic discharge (ESD) event applied between the reference supply rail and the I/O pad upon triggering the diode string. The method may include using the SCR with relatively high holding current to provide latch-up immunity in which the P+ guard ring includes first and second shallow P+ doped wells formed in the N-well structure on either side of the first diode structure.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized a need to provide negative ESD protection without compromising normal IC operation. They have therefore developed a diode string configured with a guard ring silicon-controlled rectifier (SCR) to protect against negative ESD events that allows a long diode string to be retained for normal operation while still achieving good ESD performance. In a deep N-well (D W) diode string implementation, P-type retro-well (RW) diodes are connected in series. The RW diodes inherently form vertical NPN transistors so there is current flow from the emitter to base terminals and from the emitter to collector terminals. The voltage built up during an ESD discharge linearly depends on the length of the string. In this new configuration, a P+ guard ring is placed adjacent to the first diode in the string. This enables the formation and operation of a parasitic PNP bipolar transistor formed between the RW of the first diode, the enclosing DNW of the first diode, and the adjacent P+ guard ring. In this manner, a parasitic SCR is formed by the parasitic PNP transistor coupled to the inherent NPN bipolar transistor in the first diode.

In response to a negative ESD event, the diode string is forward biased and begins to conduct current, which activates the SCR at the first diode. Once activated, the SCR conducts most of the ESD current thereby significantly reducing the current conducted by the remaining diode string. This has the effect of lowering the total voltage built up during the discharge, far below that which would have occurred with diodic conduction alone. This, in turn, allows the remaining diodes in the string to be made smaller or allows for a string that is "longer" than would be practical with diodic conduction alone. The longer diode string allows a protected input/output (I/O) pad to go more negative during normal operation without triggering the diode string or activating the SCR. The geometry and/or spacing associated with the guard ring may be adjusted to achieve higher holding current if desired to prevent latch-up during qualification testing.

Figure 1:
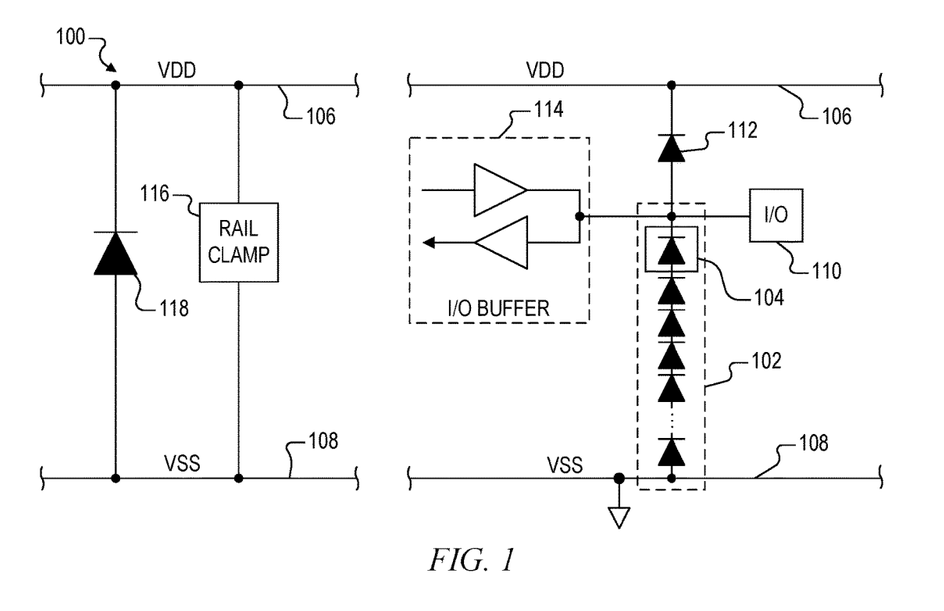
FIG. 1 is a schematic and block diagram of an integrated circuit including a diode string formed by a string of N diodes in which the first diode D1 includes a P+ guard ring implemented according to one embodiment.

FIG. 1 is a schematic and block diagram of an integrated circuit (IC) 100 including a diode string 102 formed by a string of N diodes D1, D2, DN, in which the first diode D1 includes a P+ guard ring 104 implemented according to one embodiment. The IC 100 includes a first supply voltage rail 106 developing a first supply voltage VDD, a second supply voltage rail 108 developing a second supply voltage VSS, and an input/output (I/O) pad 110. The second supply voltage VSS may be coupled to ground (GND) or otherwise develops a reference supply voltage level such as 0 Volts (V) or other suitable reference voltage level. The first supply voltage VDD has a positive voltage level relative to VSS suitable to supply power to the IC 100, such as 3V or the like.

The IC 100 further includes at least one ESD diode 112 coupled between the I/O pad 110 and the VDD rail 106, an I/O buffer 114 coupled to the I/O pad 110, a rail clamp 116 and another diode 118 both coupled between the VDD and VSS rails 106 and 108. The ESD diode 112 is shown having its anode coupled to the I/O pad 110 and its cathode coupled to the VDD rail 106, yet may represent another diode string including one or more individual diodes to protect against positive ESD events. The rail clamp 116 is configured to trigger during an ESD event and provide a path to discharge ESD current from VDD to VSS. It protects other associated circuitry of the IC 100. The diode 118 has its anode coupled to the VSS rail 108 and its cathode coupled to the VDD rail 106, and provides a path to discharge ESD current from VSS to VDD. The ESD diode 112, the rail clamp 116, and the diode 118 are not further described.

The diode string 102 includes N diodes including a first diode D1 having its cathode coupled to the I/O pad 110 and its anode coupled to the cathode of the second diode D2, which has its anode coupled to the cathode of the third diode D3, which has its anode coupled to the cathode of the fourth diode D4, which has its anode coupled to the cathode of the fifth diode D5, and so on up to the last diode DN having its anode coupled to the VSS rail 108. The P+ guard ring 104 is implemented with the first diode D1 as further described herein and shown coupled to the VSS rail 108. The diode string 102 is provided to protect against a negative ESD event applied to the I/O pad 110 relative to the VSS rail 108.

The number of diodes N of the diode string 102 is generally determined based on a trade-off between ESD protection and desired "standoff" voltage. A greater number of diodes is better for increasing the standoff voltage to prevent the diode string from being activated during normal operation. In one embodiment, for example, the IC 110 may by implemented for performing wireless communications, in which the I/O pad 110 may be coupled to an external antenna (not shown). In such a wireless application, the external antenna may be configured to drive the voltage of the I/O pad 110 to a negative voltage level. The number N of diodes should be selected to ensure that the diode string 102 is not activated during such operation.

In one embodiment, for example, the forward bias of each of the diodes D1-DN may be about 0.5V during normal operating conditions. If an external antenna is configured such that it may drive the I/O pad 110 to a voltage of −2.5V during normal operation, then N should be greater than 5 to ensure that the diode string 102 is not activated since it would introduce unintended and undesired current to the I/O pad 110 that could adversely affect normal operation. Also, even when the voltage of the I/O pad 110 nears the forward bias voltage without actually reaching the forward bias voltage, leakage current from the diode string 102 to the I/O pad 110 increases which could also adversely affect normal operation. Furthermore, under certain conditions, such as increased temperature, the built-in diode potential decreases which reduces the turn-on voltage of the individual diodes increasing the leakage current and reducing the standoff voltage of the diode string. For example, the diode built-in potential may decrease by about 2 millivolts (mV) per degree Celsius (° C.) rise in operating temperature.

On the other hand, a smaller number of diodes is better for ESD protection because it reduces the trigger voltage, the turn-on resistance ($R_{ON}$), and the clamping voltage during conduction which in turn reduces the amount of power transferred to the IC 100 during a negative ESD event. A larger number of diodes increases the standoff voltage and the amount of time that is needed to activate the diode string. A larger number of diodes also increases total resistance of the string causing more power to be transferred to the integrated circuit during the ESD event. The number N of diodes of the diode string 102, therefore, is selected to minimize the chance of activation and leakage current while also maintaining acceptable ESD protection. The number of diodes in an ESD diode string depends upon the operating conditions of the particular application.

Figure 2:
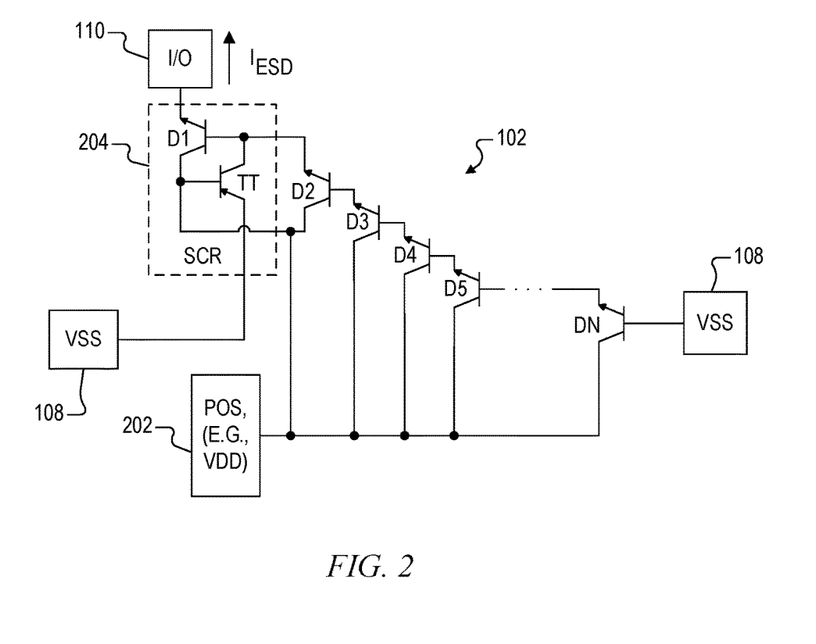
FIG. 2 is a schematic representation of the diode string of FIG. 1 implemented according to one embodiment.

FIG. 2 is a schematic representation of the diode string 102 implemented according to one embodiment. Each of the diodes D1-DN are implemented in silicon as a parasitic NPN bipolar junction transistor (BJT). The emitter terminal of the first NPN transistor, which forms the cathode of the first diode D1, is coupled to the I/O pad 110, and the base terminal of the first transistor, which forms the anode of D1, is coupled to the emitter terminal of the second NPN transistor, which forms the cathode of D2. Continuing in this manner, the base terminal of D2 is coupled to the emitter terminal of D3, having its base terminal coupled to the emitter terminal of D4, having its base terminal coupled to the emitter terminal of D5, and so on up to the last diode DN having its base terminal coupled to the VSS rail 108. Although the number N of diodes in the diode string 102 is shown in FIG. 2 as having at least 6 diodes, N may be any suitable number less than, equal to, or greater than 6 depending upon the particular implementation or application. The collector terminals of each of the NPN BJTs implementing the diodes D1-DN are coupled together at a positive (POS) voltage node 202, in which POS has any suitable voltage level that is less than, equal to, or even greater than VDD. In one embodiment, the collector terminals of each of the NPN BJTs implementing the diodes D1-DN are coupled together at the VDD rail 106 rather than to a separate voltage node.

When only the diodes D1-DN are included in the diode string 102 without further modification, then in the event of a negative ESD event applied to the I/O pad 110, electrostatic discharge current $I_{ESD}$ flows from the VSS rail 108 to the I/O pad 110 through each of the diodes D1-DN (diodic current), while a portion of the current also flows to the POS voltage node 202. The inherent turn-on resistance of each of the transistors forming the diodes of the diode string develop increasing voltage as the ESD current increases, so that the diode string absorbs a significant amount of power in response to the negative ESD event. The clamping voltage developed across diode string can also cause damage on the element connected in parallel between the I/O pad 110 and the VSS rail 108. Such a configuration may exhibit poor ESD performance particularly for a long diode string with a larger number of diodes.

Instead, the formation of the diode string 102 is modified to include the P+ guard ring 104 adjacent the first diode D1, which forms a parasitic PNP transistor TT coupled to the first diode D1. As shown, the collector terminal of TT is coupled to the base terminal of D1, the base terminal of TT is coupled to the collector terminal of D1, and the emitter terminal of TT is coupled to the VSS rail 106. The configuration of D1 and TT collectively forms a Silicon-Controlled Rectifier (SCR) 204. As described further herein, the SCR 204 is not activated unless and until each of the diodes D1-DN are forward biased to trigger the diode string 102 to conduct current. When the SCR 204 is activated upon triggering the diodes D1-DN, it conducts most of the ESD current thereby significantly reducing any current conducted by the remaining diodes D2-DN. Activation of the SCR 204 also lowers the total voltage built up during the discharge event to a level that is significantly less that which would have occurred with diodic conduction alone.

The addition of the P+ guard ring 104 forming the parasitic PNP transistor TT coupled to the first diode D1, which in turn forms the SCR 204, enables the first diode D1 to consume most of the current of the ESD event. The remaining diodes D2-DN may be made smaller and/or the number N of diodes of the diode string 102 may be increased to more than that which would be practical with diodic conduction alone. A longer diode string 102 substantially increases the standoff voltage and thus decreases the chance of activation and further minimizes leakage current during normal operation. In addition, the standoff voltage of the diode string 102 may be increased without adversely affecting ESD protection since even though a greater turn on voltage is needed, once turned on, the SCR 204 is activated to reduce the voltage and to redirect the current from the diodes D2-DN to the SCR 204. In this manner, the turn on resistance and corresponding power dissipation of each of the diodes in the diode string 102 during the ESD event is substantially reduced and rendered inconsequential. Once the SCR 204 is activated, the remaining ESD current flows from the VSS rail 106 through TT and to the I/O pad 110. The current may further flow to the POS voltage node 202 (which may be the VDD rail 106).

Figure 3:
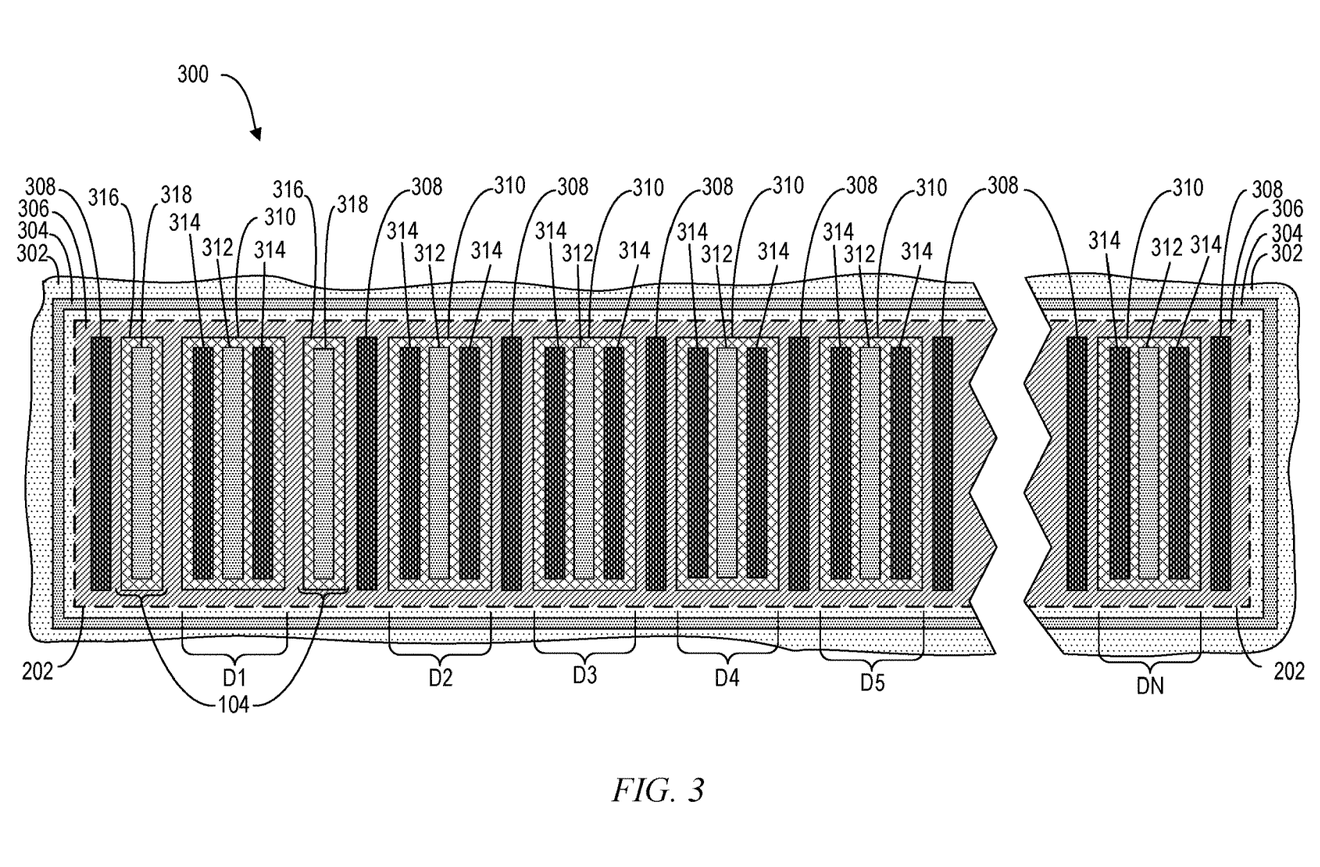
FIG. 3 is an overhead view of a layout topology of the diode string according to one embodiment formed on the IC of FIG. 1.

FIG. 3 is an overhead view of a layout topology 300 formed on the IC 100 used to implement the diode string 102 including the SCR 204 according to one embodiment. The IC 100 includes a P-type substrate 302, and a rectangular-shaped area outlined by a dashed line denotes an N-well structure 306 in which the diode string 102 is formed. A P-type diffusion ring 304 is formed surrounding the area of the N-well structure 306. A series of elongated N+ doped regions 308 are distributed and spaced apart within the N-well structure 306. A wider, elongated P-type retro-well (RW) 310 is formed between each consecutive pair of the distributed N+ doped regions 308. Each of the diodes D1-DN is formed in a respective one of the RWs 310. As shown, diode D1 is formed in the RW 310 between the first and second N+ doped regions 308, diode D2 is formed in the RW 310 between the second and third N+ doped regions 308, and so on up to the last diode DN, which is formed in the RW 310 between the last two N+ doped regions 308.

Each of the diodes D1-DN may be formed in substantially the same manner. As shown, an elongated P+ doped region 312 is formed at or near the center of a corresponding one of the RWs 310, and a pair of elongated N+ doped regions 314 are formed on either side of the P+ doped region 312 within the corresponding RW 310. Each P+ doped region 312 is doped more heavily than the RWs 310, which are more lightly doped. In an alternative embodiment, only a single N+ doped region may be included for any one or more of the diodes D1-DN rather than the two separate N+ doped regions 314.

The P+ guard ring 104 includes at least one of a pair of thicker elongated RWs 316 formed on either side of the RW 310 of the first diode D1, each formed between the first diode D1 and a corresponding one of the pair of N+ doped regions 308 for the first diode D1. In addition, each of a pair of elongated P+ doped regions 318 is formed within a corresponding one of the RWs 316. It is noted that the P+ guard ring 104 may be implemented with only one RW 316 and corresponding P+ doped region 318 formed therein. As described further herein, the P+ guard ring 104 comprising at least one of the pair of RWs 316 and the corresponding RW 310 of the first diode D1 implement at least one parasitic PNP transistor TT coupled to the NPN transistor of the first diode D1 to form the SCR 204.

Figure 4:
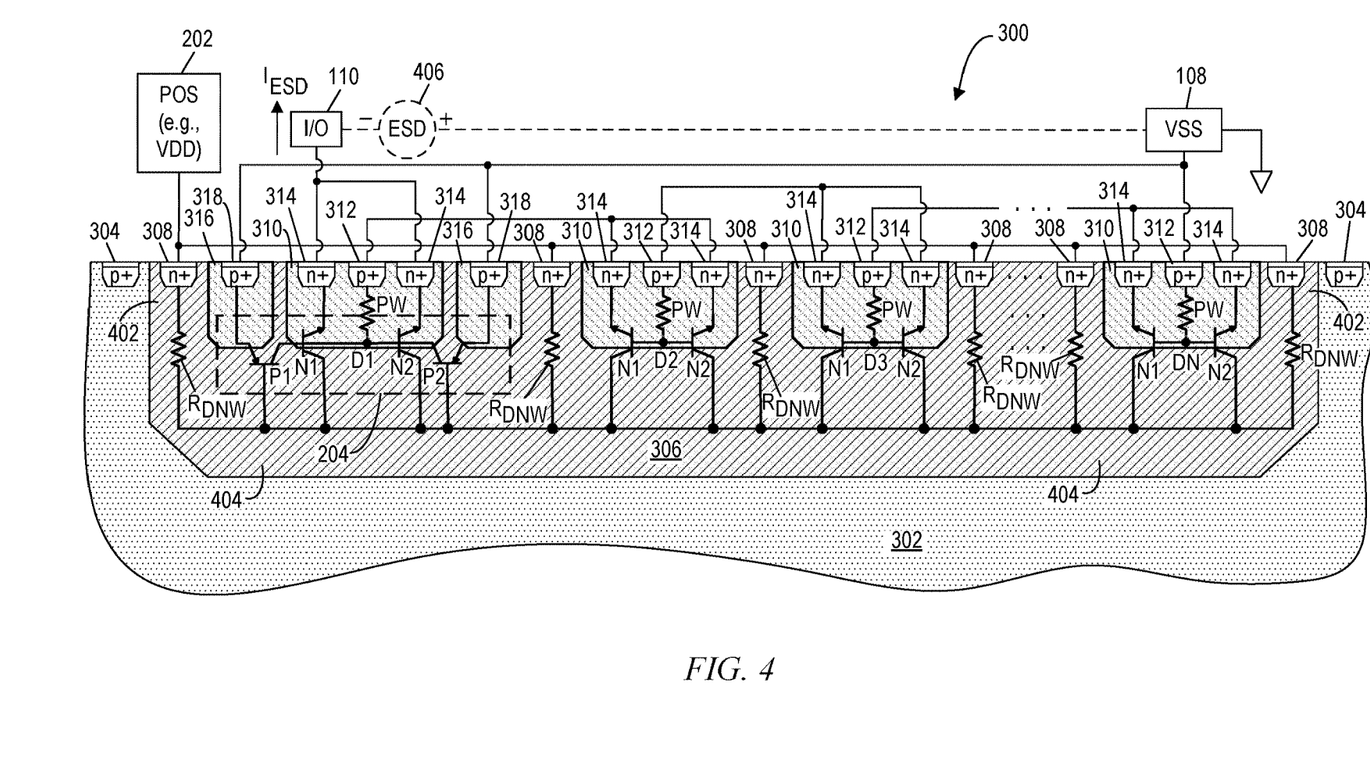
FIG. 4 is a partial cross-sectional view of the layout topology of FIG. 3 of the diode string according to one embodiment formed on the IC of FIG. 1.

FIG. 4 is a partial cross-sectional view of the layout topology 300 of the diode string 102 according to one embodiment formed on the IC 100. The IC 100 includes the P-type substrate 302, the P-type diffusion ring 304 and the N-well structure 306 formed within the P-type substrate 302 as illustrated. The N-well structure 306 includes a shallow N-well 402 formed on top of a deep N-well (DNW) 404. The DNW 404 and the shallow N-well 402 are generally modeled according to a Poisson distribution to form the N-well structure 306. In one embodiment, for example, the depth of the peak doping of the DNW 404 is around 1.3 micro-meter (μm), and the depth of the peak doping of the shallow N-well 402 is around 0.25 μm, in which these two separate layers integrally meet at 0.8 μm deep within the N-well structure 306. Rather than showing separate levels, the N-well structure 306 is shown as a contiguous N+ doped region.

The RWs 310 are shown as larger wells that cover the region not defined as shallow N-well 402 and extend downwards towards the DNW 404. The RWs 316 are formed in a similar manner with similar depth yet may be narrower than the RWs 310. In one embodiment, the RWs 310 and 316 intersect the DNW 404 at a depth of about 0.6 μm-0.7 μm. The N+ doped regions 308 and 314 and the P+ doped regions 312 and 318 are each shown as narrower, shallow tubs or wells, in which the N+ doped regions 308 are distributed and formed in the shallow N-well 402, the P+ doped regions 312 and the N+ doped regions 314 are formed in the RWs 310 for each of the diodes D1-DN, and the P+ doped regions 318 are formed in the RWs 316 of the P+ guard ring 104 as previously described. Although not explicitly called out, a conductive layer is formed on top of each of the N+ doped regions 308 and 314 and the P+ doped regions 312 and 318 for external electrical connection as further described herein.

An inherent resistance $R_{DNW}$ is formed between each of the N+ doped regions 308 and the DNW 404. Each of the N+ doped regions 308 are also externally coupled together and electrically coupled to the POS voltage node 202, which may be the VDD rail 106 (rather than a separate node). Generally, this means that each of the N+ doped regions 308 and the DNW 404 are charged to a positive voltage level, such as VDD or the like. The N+ doped regions 314 of the first diode D1 are both externally coupled to the I/O pad 110, and the P+ doped region 312 of the first diode D1 is externally coupled to both of the N+ doped regions 314 of the second diode D2. The P+ doped region 312 of the second diode D2 is externally coupled to both of the N+ doped regions 314 of the third diode D3, the P+ doped region 312 of the third diode D3 is externally coupled to both of the N+ doped regions 314 of the fourth diode D4, and this pattern is repeated up to the last diode DN, which has its P+ doped region 312 externally coupled to the VSS rail 108. This coupling implements the series coupling of the diodes D1-DN together between the I/O pad 110 and the VSS rail 108 as shown in FIG. 1. Both of the P+ doped regions 318 of the P+ guard ring 104 are coupled to the VSS rail 108.

Each of the diodes D1-DN includes a pair of inherent parasitic NPN bipolar transistors N1 and N1 coupled in parallel to form the inherent parasitic NPN bipolar transistor of the diode (such as shown in FIG. 2). In each case, the emitter terminal of N1 is coupled to a first N+ doped region 314 of the diode, the emitter terminal of N2 is coupled to a second N+ doped region 314 of the diode, the base terminals of N1 and N2 are coupled together and resistively coupled to the corresponding P+ doped region 312 of the diode, and the collector terminals are coupled to the DNW 404.

The first RW 316 and corresponding P+ doped region 318 forms a first parasitic PNP transistor P1 coupled to the transistor N1 of the first diode D1, and the second RW 316 and corresponding P+ doped region 318 forms a second parasitic PNP transistor P2 coupled to the transistor N2 of the first diode D1. As shown, the emitter terminal of P1 coupled to a first P+ doped region 318 is thus coupled to VSS, the collector terminal of P1 is coupled to the base terminals of N1 and N2 of D1, and the base terminal of P1 is coupled to the DNW 404. In similar manner, the emitter terminal of P2 coupled to a second P+ doped region 318 is thus coupled to VSS, the collector terminal of P2 is coupled to the base terminals of N1 and N2 of D1, and the base terminal of P2 is coupled to the DNW 404. The addition of the parasitic PNP bipolar transistors P1 and P2 coupled to the transistors N1 and N2 of the first diode D1 forms the SCR 204.

A voltage source 406 is shown in dashed lines having its positive terminal coupled to the VSS rail 108 and its negative terminal coupled to the I/O pad 110, and represents a negative ESD event at the I/O pad 110 generating the ESD current $I_{ESD}$ similar to that shown in FIG. 2. As previously described, in response to the negative ESD event, the diode string 102 is activated when each of the diodes D1-DN is forward biased. The SCR 204 is turned on when the diode string 102 is activated, and once the SCR 204 is turned on, the voltage snaps back to a holding voltage as further described herein, and the diode string 102 is then effectively de-activated for the remainder of the ESD event. After the diode string 102 is de-activated, the SCR 204 essentially draws most if not substantially all of the ESD current $I_{ESD}$.

Figure 5:
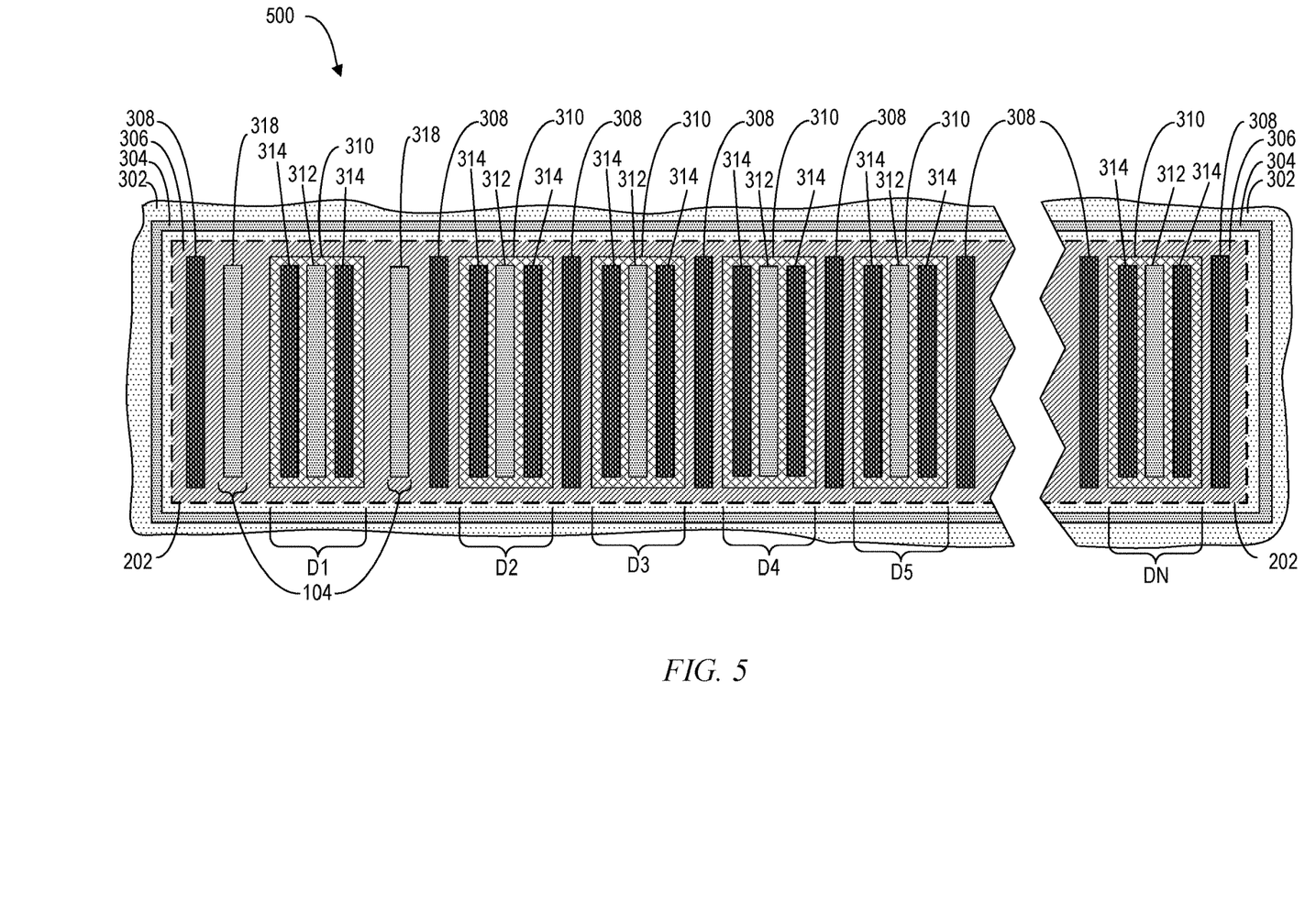
FIG. 5 is an overhead view of a layout topology of the diode string according to another embodiment formed on the IC of FIG. 1.
Figure 6:
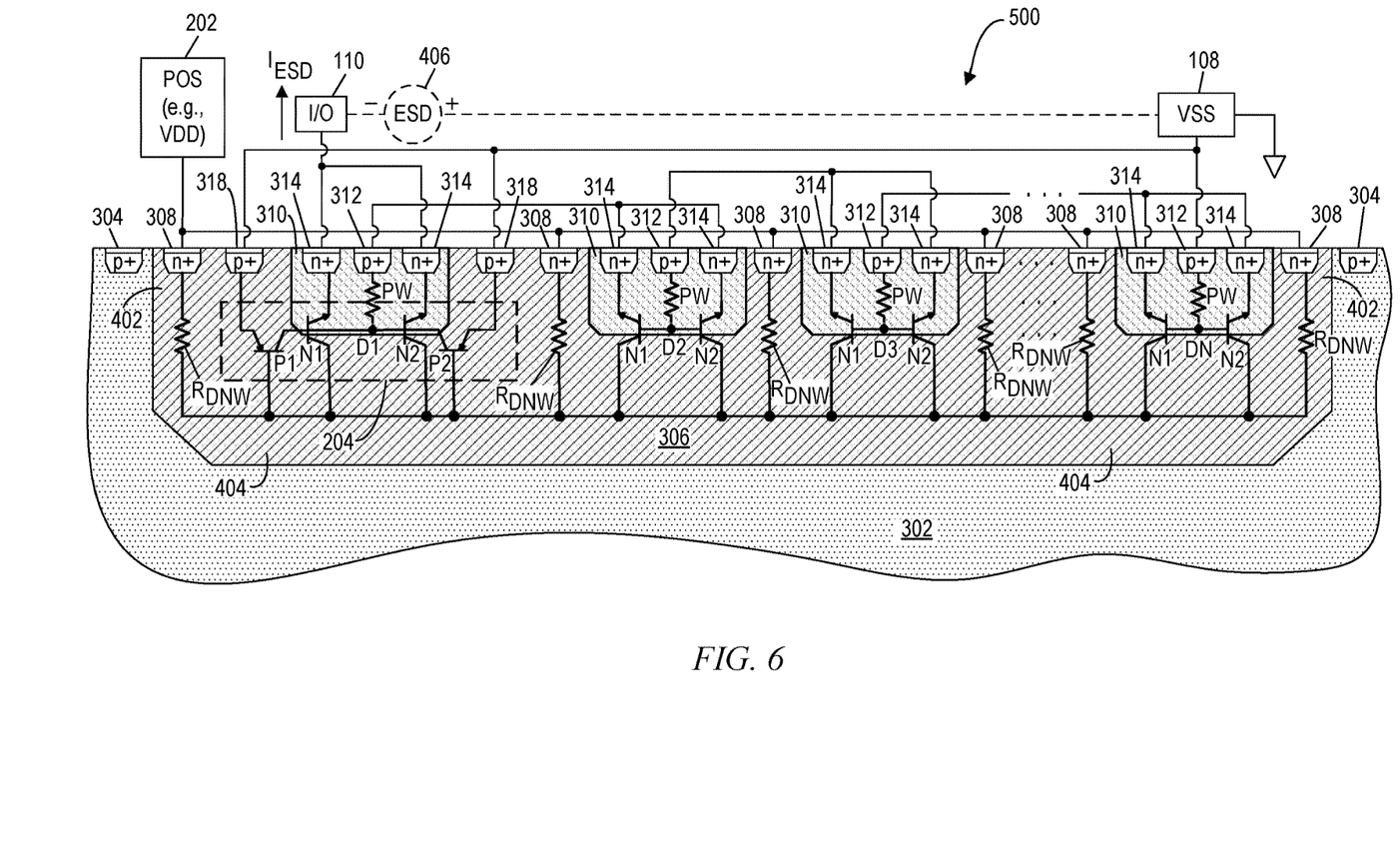
FIG. 6 is a partial cross-sectional view of the layout topology of FIG. 5 of the diode string formed on the IC of FIG. 1.

FIG. 5 is an overhead view of a layout topology 500 of the diode string 102 according to another embodiment formed on the IC 100, and FIG. 6 is a corresponding partial cross-sectional view of the layout topology 500 of the diode string 102. The layout topology 500 is substantially similar to the layout topology 300, except that the RWs 316 on either side of the RW 310 of the first diode D1 for the layout topology 300 are removed in the layout topology 500, whereas the P+ doped regions 318 remain to form the P+ guard ring 104. Otherwise, the geometry is substantially the same. For the layout topology 500, the P+ guard ring 104 is formed by at least one of the pair of elongated P+ doped regions 318, which are formed directly within the shallow N-well 402 on either side of the RW 310 of the first diode D1. In a similar manner as described previously, the P+ guard ring 104 may include only one P+ doped region 318 rather than the pair disposed on opposite sides of the RW 310 of the first diode D1. Also, the P+ guard ring 104 comprising at least one of the pair of P+ doped regions 318 and the corresponding RW 310 of the first diode D1 implement at least one parasitic PNP transistor TT (either P1 or P2 or both) coupled to the NPN transistor of the first diode D1 to form the SCR 204. As shown, two parasitic PNP transistors P1 and P2 are formed and coupled in parallel when both P+ doped regions 318 are included.

Operation is similar, except that the removal of the RWs 316 increases the base-width of the PNP transistors P1 and P2, which reduces the transistor's current gain beta and weakens the resulting SCR 204 which further increases the holding current of the SCR 204 during the negative ESD event. As described further herein, the increased holding current improves latch-up performance to better prevent latch-up during qualification testing.

Figure 7:
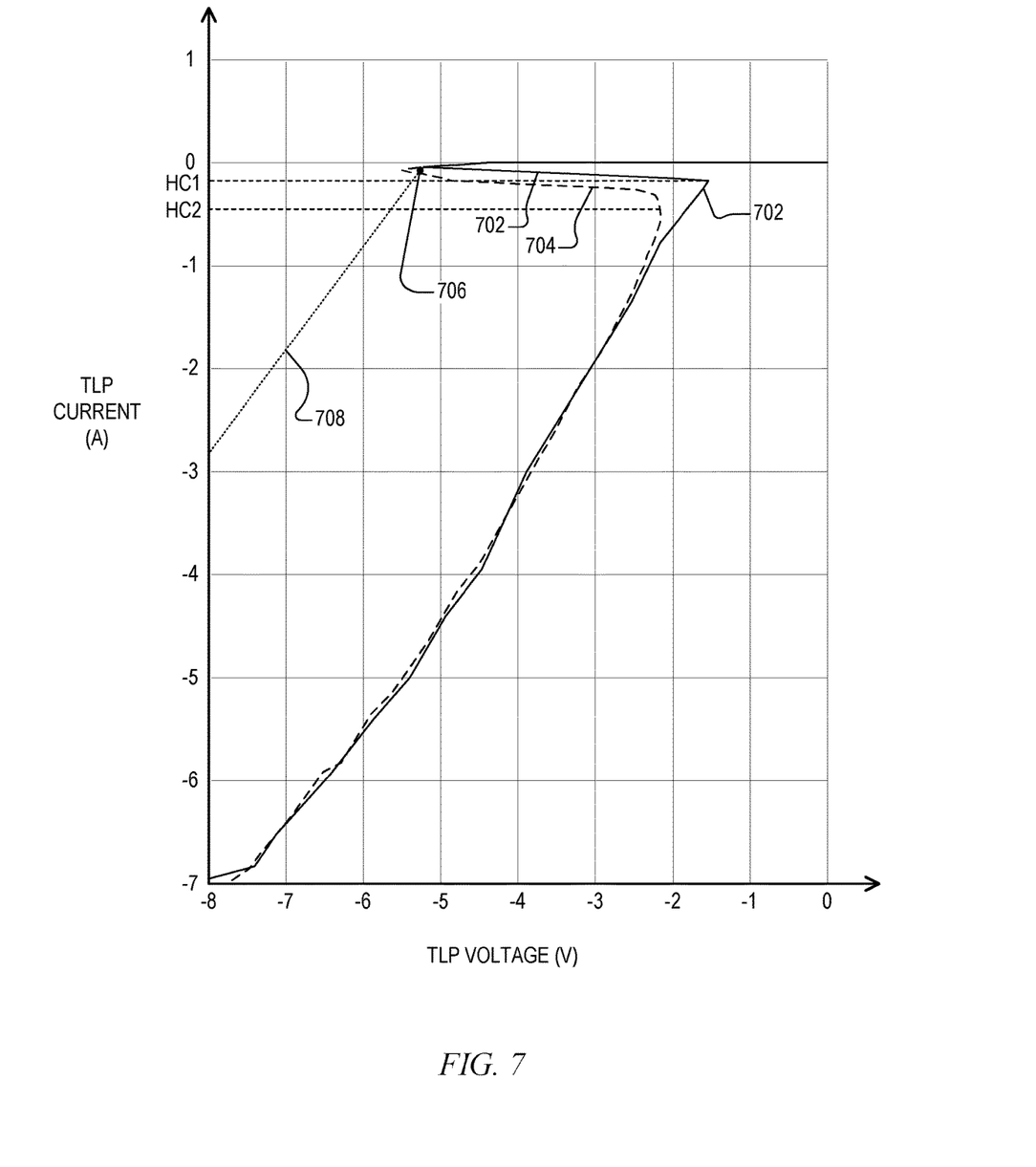
FIG. 7 is a graphic diagram illustrating operation of both layout topologies of FIGS. 3 and 5 implemented according to a specific configuration in response to a transmission line pulse (TLP).

FIG. 7 is a graphic diagram illustrating operation of both layout topologies 300 and 500 implemented according to a specific configuration in response to a transmission line pulse (TLP) stimulus. The graphic diagram plots TLP current in Amperes (A) verses TLP voltage in Volts (V) for a first curve 702 illustrating holding current for the layout topology 300 and a second curve 704 illustrating holding current for the layout topology 500. The TLP simulates a negative ESD event for both topologies. For both topologies, a voltage triggering point 706 is shown indicating that the SCR 204 is not activated until the voltage drops to about −5.5V. The triggering point 706 is roughly the same for both curves 702 and 704, although the triggering point for the layout topology 500 is about 0.3V higher than that for the layout topology 300.

Both curves 702 and 704 are similar in that in response to application of the TLP, the TLP voltage increases to the triggering point 706 and then snaps back to a respective holding voltage indicative of a corresponding holding current. Then the curves increase from their respective holding voltages and quickly converge effectively having the same $R_{ON}$. In contrast for a configuration without the SCR 204, the diode string 102 would conduct substantially all the current so that the voltage-current relationship would roughly follow a dotted line 708 at an increase of about 5.5V thereby dissipating a substantially greater amount of power in the IC 100.

The holding voltage of the curve 702 for the layout topology 300 corresponds with a holding current HC1 and the holding voltage of the curve 704 for the layout topology 500 corresponds with a holding current HC2. The holding current is defined as the minimum level of current needed to sustain conduction of the SCR 204. Once the SCR 204 is activated and the holding current is achieved for a given layout topology, the SCR 204 latches the I/O pad 110 to the VSS rail 108. During a negative ESD event (when the IC 100 is unpowered), this latching is desired since the SCR 204 activates and dissipates the ESD energy. Latching is not desired, however, during normal operation or during qualification testing of the IC 100, so that an increased holding current level is advantageous for qualification testing purposes. During qualification testing, the degree of immunity to a phenomenon known of latch-up is characterized. During latch-up, an undesired (high) current can flow in the IC in response to test stimulus, where this high current can cause permanent damage to the IC. A holding current for the SCR 204 that exceeds the magnitude of the test current injected is desirable so that SCR action cannot be sustained. In other words, a higher holding current prevents conduction of the SCR 204 during the latch-up test portion of qualification testing. In one embodiment, for example, about +/−100 mA is injected into the chip I/O pads during latch-up testing.

In the illustrated HC2 represents an increase of about 280 mA relative to HC1, so that the layout topology 500 exhibits improved latch-up immunity performance as compared to the layout topology 300. It is appreciated, therefore, that the geometry of the P+ guard ring 104 forming the SCR 204 may be modified to increase the holding current to achieve a desired level latch-up immunity performance for different configurations. In general, the holding current is increased by removing the retro-wells which increases the base width and reduces the beta of the PNP transistor TT.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A semiconductor circuit, comprising:
   an N-well structure formed in a substrate, wherein said N-well structure is electrically coupled to a positive voltage node;
   a plurality of N+ doped regions formed in and distributed across said N-well structure each coupled to said positive voltage node;
   a diode string comprising a plurality of NPN transistor diode structures formed in said N-well structure and electrically coupled in series having a first diode structure disposed at a first end of said diode string and a last diode structure disposed at a second and opposite end of said diode string, and wherein each of said plurality of diode structures is disposed between a corresponding consecutive pair of said plurality of N+ doped regions; and
   a P+ guard ring comprising at least one P+ doped structure formed in said N-well structure disposed on either side of said first diode structure and electrically coupled to a reference voltage node, wherein said P+ guard ring forms a silicon-controlled rectifier (SCR) with said first diode structure.

2. The semiconductor circuit of claim 1, wherein said P+ guard ring comprises first and second P+ doped structures formed in said N-well structure disposed on either side of said first diode structure and electrically coupled to said reference voltage node, and wherein said first and second P+ doped structures form an SCR with said first diode structure.

3. The semiconductor circuit of claim 1, wherein each of said plurality of diode structures comprises a P-type retro-well structure including at least one N+ doped region and at least one P+ doped region.

4. The semiconductor circuit of claim 3, wherein each of said plurality of diode structures comprises a pair of said N+ doped regions disposed on either side of one P+ doped region within a corresponding one of said plurality of P-type retro-well structures.

5. The semiconductor circuit of claim 3, wherein for each of said plurality of diode structures from said first diode structure to said last diode structure, said at least one P+ doped region of one diode structure is coupled to said at least one N+ doped region of a next diode structure.

6. The semiconductor circuit of claim 3, wherein said at least one N+ doped region of each of said plurality of diode structures forms at least one parasitic NPN transistor with a deep N-well (DNW) portion of said N-well structure, and wherein said at least one P+ doped structure of said P+ guard ring forms at least one parasitic PNP transistor coupled to said at least one parasitic NPN transistor of said first diode structure to form said SCR.

7. The semiconductor circuit of claim 1, wherein said positive voltage node comprises a positive supply rail of the semiconductor circuit.

8. The semiconductor circuit of claim 1, wherein said P+ guard ring comprises:
first and second lightly doped P-type retro-wells formed in said N-well structure disposed on either side of said first diode structure; and
a first P+ doped region formed in said first P-type retro-well and a second P+ doped region formed in said second P-type retro-well;
wherein said SCR exhibits a relatively low holding current when activated by said diode string.

9. The semiconductor circuit of claim 1, wherein said P+ guard ring comprises:
first and second P+ doped regions formed in said N-well structure disposed on either side of said first diode structure; and
wherein said SCR exhibits a relatively high holding current when activated by said diode string.

10. An integrated circuit, comprising:
a reference supply rail developing a reference supply voltage, an input/output (I/O) pad, and a positive voltage node;
a P-type substrate and an N-well structure formed in said P-type substrate, wherein said N-well structure is electrically coupled to said positive voltage node;
a plurality of N+ doped regions formed in and distributed across said N-well structure each coupled to said positive voltage node;
a diode string comprising a plurality of NPN transistor diode structures formed in said N-well structure and electrically coupled in series having a first diode structure disposed at a first end of said diode string and a last diode structure disposed at a second and opposite end of said diode string, wherein each of said plurality of diode structures is disposed between a corresponding consecutive pair of said plurality of N+ doped regions, and wherein said first diode structure is electrically coupled to said I/O pad and wherein said last diode structure is coupled to said reference supply rail; and
a P+ guard ring comprising at least one P+ doped structure formed in said N-well structure disposed on either side of said first diode structure and electrically coupled to said reference voltage node, wherein said P+ guard ring forms a silicon-controlled rectifier (SCR) with said first diode structure.

11. The integrated circuit of claim 10, wherein said P+ guard ring comprises first and second P+ doped structures formed in said N-well structure disposed on either side of said first diode structure and electrically coupled to said reference supply rail, and wherein said first and second P+ doped structures form said SCR with said first diode structure.

12. The integrated circuit of claim 10, wherein each of said plurality of diode structures comprises a P-type retro-well structure including at least one N+ doped region and at least one P+ doped region.

13. The integrated circuit of claim 10, wherein said positive voltage node comprises a positive supply rail of the integrated circuit.

14. The integrated circuit of claim 10, wherein said P+ guard ring comprises:
first and second lightly doped P-type retro-wells formed in said N-well structure disposed on either side of said first diode structure; and
a first P+ doped region formed in said first P-type retro-well and a second P+ doped region formed in said second P-type retro-well;
wherein said SCR exhibits a relatively low holding current when activated by said diode string.

15. The integrated circuit of claim 10, wherein said P+ guard ring comprises:
first and second P+ doped wells formed in said N-well structure disposed on either side of said first diode structure; and
wherein said SCR exhibits a relatively high holding current when activated by said diode string.

16. The integrated circuit of claim 15, wherein said holding current is sufficiently high to provide latch-up immunity.

17. The integrated circuit of claim 10, wherein said diode string is configured to be triggered at a trigger voltage in response to a negative electrostatic discharge (ESD) event applied between said reference supply rail and said I/O pad, and wherein said SCR is activated in response to said diode string being triggered to clamp said I/O pad to said reference supply rail to dissipate remaining energy of said negative ESD event.

18. The integrated circuit of claim 17, wherein when said SCR is activated, a holding voltage is developed across said SCR that is less than said trigger voltage, wherein said diode string is turned off, and wherein said SCR conducts remaining current of said ESD event.

19. A method, comprising using the SCR of the integrated circuit of claim 10 to discharge current of a negative electrostatic discharge (ESD) event applied between the reference supply rail and the I/O pad upon triggering the diode string.

20. The method of claim 19, wherein said using the SCR comprises using the SCR with relatively high holding current in which the P+ guard ring comprises first and second P+ doped wells formed in said N-well structure on either side of said first diode structure.

* * * * *